United States Patent
Nobuhara (10) Patent No.: US 8,090,228 B2
(45) Date of Patent: Jan. 3, 2012

(54) PHOTOELECTRIC CONVERSION DEVICE, PHOTOELECTRIC CONVERSION MODULE AND METHOD OF MANUFACTURING PHOTOELECTRIC CONVERSION DEVICE

(75) Inventor: Hiroyuki Nobuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 414 days.

(21) Appl. No.: 12/382,909

(22) Filed: Mar. 26, 2009

(65) Prior Publication Data
US 2009/0323748 A1 Dec. 31, 2009

(30) Foreign Application Priority Data
Jun. 30, 2008 (JP) .................. 2008-171762

(51) Int. Cl.
G02B 6/12 (2006.01)
G02B 6/36 (2006.01)
G02B 6/38 (2006.01)

(52) U.S. Cl. ........... 385/14; 385/76; 385/77; 385/78; 385/82; 385/88; 385/89; 385/92

(58) Field of Classification Search .............. 385/14, 385/88, 89, 92
See application file for complete search history.

(56) References Cited

U.S. PATENT DOCUMENTS

| 6,623,178 B1 * | 9/2003 | Sakurai et al. .......... 385/92 |
| 7,128,474 B2 | 10/2006 | Giboney et al. |
| 7,488,122 B2 * | 2/2009 | Hashimoto et al. ....... 385/92 |
| 2004/0114866 A1 * | 6/2004 | Hiramatsu ............. 385/39 |
| 2006/0140550 A1 * | 6/2006 | Chen et al. ............. 385/92 |

FOREIGN PATENT DOCUMENTS

| JP | 6-84326 | 12/1994 |
| JP | 2003-232944 | 8/2003 |
| JP | 2005-286225 | 10/2005 |
| JP | 2007-94153 | 4/2007 |
| JP | 2007-249194 | 9/2007 |
| JP | 2007-271998 | 10/2007 |

* cited by examiner

Primary Examiner — Ryan Lepisto
(74) Attorney, Agent, or Firm — Staas & Halsey LLP (57) ABSTRACT

A photoelectric conversion device includes a circuit substrate that has a first concave portion having a light transmission hole, a first metal interconnection that is formed from a bottom of the first concave portion to a face of the circuit substrate where the first concave portion is formed, an optical element that is arranged in the first concave portion so that an optical axis thereof passes through the light transmission hole and is flip-chip bonded to the first metal interconnection on the bottom of the first concave portion, and a circuit chip that is a driver circuit chip for driving the optical element or an amplifier circuit chip for amplifying a signal from the optical element and is flip-chip bonded to the first metal interconnection of the face where the first concave portion is formed.

12 Claims, 5 Drawing Sheets

PHOTOELECTRIC CONVERSION DEVICE, PHOTOELECTRIC CONVERSION MODULE AND METHOD OF MANUFACTURING PHOTOELECTRIC CONVERSION DEVICE

CROSS-REFERENCE TO RELATED APPLICATION

This application is based upon and claims the benefit of priority of the prior Japanese Patent Application No. 2008-171762, filed on Jun. 30, 2008, the entire contents of which are incorporated herein by reference.

FIELD

The present invention generally relates to a photoelectric conversion device, a photoelectric conversion module and a method of manufacturing a photoelectric conversion device.

BACKGROUND

A photoelectric conversion module has a transmitter for converting an electric signal to an optical signal and/or a receiver for converting an optical signal to an electric signal. The transmitter has a light-emitting element and a driver circuit chip for driving the light-emitting element. The receiver has a light-receiving element and an amplifier circuit for amplifying a signal current generated in the light-receiving element. Hereinafter, the light-emitting element and the light-receiving element are referred to as an optical element. The driver circuit and the amplifier circuit are referred to as a circuit chip.

It is preferable that an interconnection between the optical element and the circuit chip has small length and a mounting are is reduced, in order to downsize the photoelectric conversion module. U.S. Pat. No. 7,128,474 discloses a photoelectric conversion module in which an optical element is laminated on a surface of a circuit chip.

SUMMARY

According to an aspect of the present invention, there is provided a photoelectric conversion device including a circuit substrate that has a first concave portion having a light transmission hole, a first metal interconnection that is formed from a bottom of the first concave portion to a face of the circuit substrate where the first concave portion is formed, an optical element that is arranged in the first concave portion so that an optical axis thereof passes through the light transmission hole and is flip-chip bonded to the first metal interconnection on the bottom of the first concave portion, and a circuit chip that is a driver circuit chip for driving the optical element or an amplifier circuit chip for amplifying a signal from the optical element and is flip-chip bonded to the first metal interconnection of the face where the first concave portion is formed.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

A description will now be given of embodiments with reference to the accompanying drawings.

First Embodiment

Figure 1:
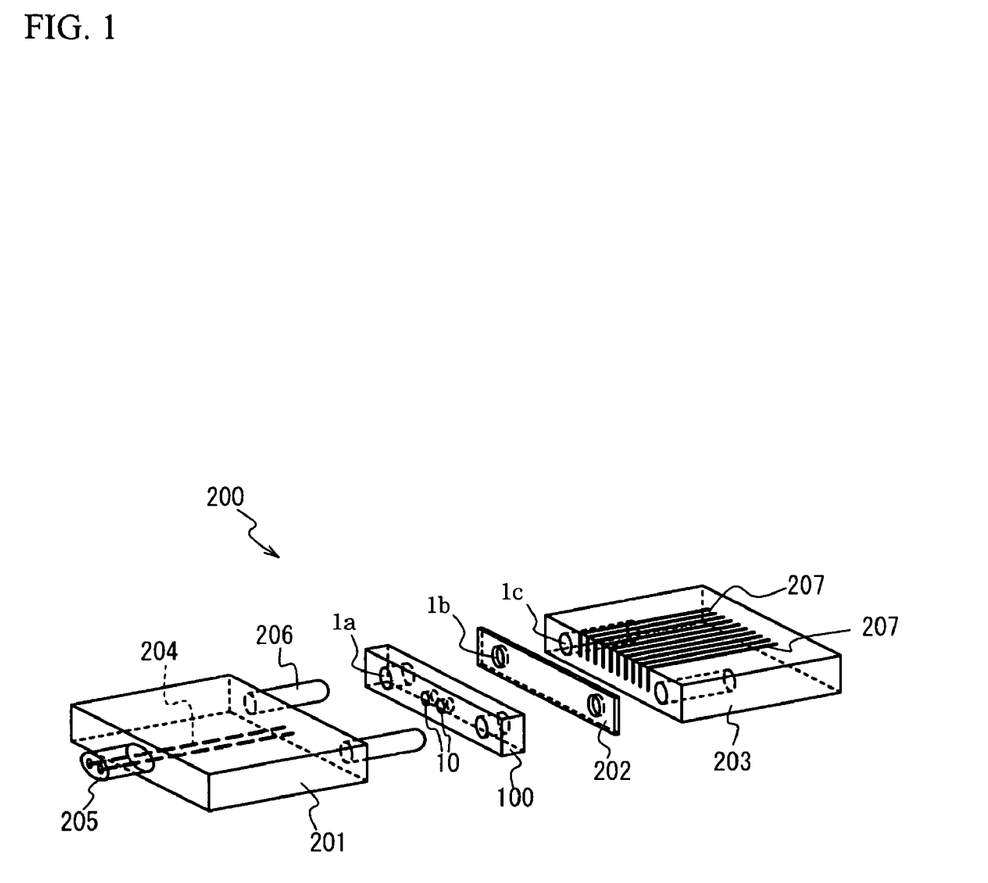
FIG. 1 illustrates an exploded perspective view of a photoelectric conversion module having a photoelectric conversion device in accordance with a first embodiment.

FIG. 1 illustrates an exploded perspective view of a photoelectric conversion module 200 having a photoelectric conversion device 100 in accordance with a first embodiment. As illustrated in FIG. 1, the photoelectric conversion module 200 has a structure in which an optical connector 201, the photoelectric conversion device 100, an electrode contact sheet 202, and an electric connector substrate 203 are coupled to each other in order.

The optical connector 201 is a connector to be connected to an external optical fiber. The optical connector 201 has an optical fiber core 204. In this embodiment, the optical connector 201 has two of the optical fiber cores 204. An optical fiber tape 205 is provided at an edge of the optical fiber core 204 on an opposite side of the photoelectric conversion device 100. The optical connector 201 has a guide pin 206 on the photoelectric conversion device 100 side.

The photoelectric conversion device 100 has a structure in which an optical element and a circuit chip are mounted on a circuit substrate. A light transmission hole 10 is formed in the photoelectric conversion device 100 so that an optical axis of the optical fiber core 204 passes through the light transmission hole 10. Therefore, two of the light transmission holes 10 are formed in the embodiment. A first hole 1a where the guide pin 206 is to be inserted is formed in the photoelectric conversion device 100. A description will be given of details of the photoelectric conversion device 100 later.

The electric contact sheet 202 is a sheet member for securing an electrical connection between the electric connector substrate 203 and the photoelectric conversion device 100. The electrode contact sheet 202 has a via interconnection. A second hole 1b where the guide pin 206 is to be inserted is formed in the electrode contact sheet 202.

The electric connector substrate 203 is a connector that connects an external electric interface and the photoelectric conversion device 100. The electric connector substrate 203 is, for example, a connector to be connected to a universal system bus (USB) port. The electric connector substrate 203 has an electric interconnection 207 at a position according to the via interconnection of the electrode contact sheet 202. A third hole 1c where the guide pin 206 is to be inserted is formed in the electric connector substrate 203.

The position of the optical connector 201, the photoelectric conversion device 100, the electrode contact sheet 202 and the electric connector substrate 203 is determined when the guide pin 206 is inserted into the first hole la through the third hole 1c in order.

Figure 2A:
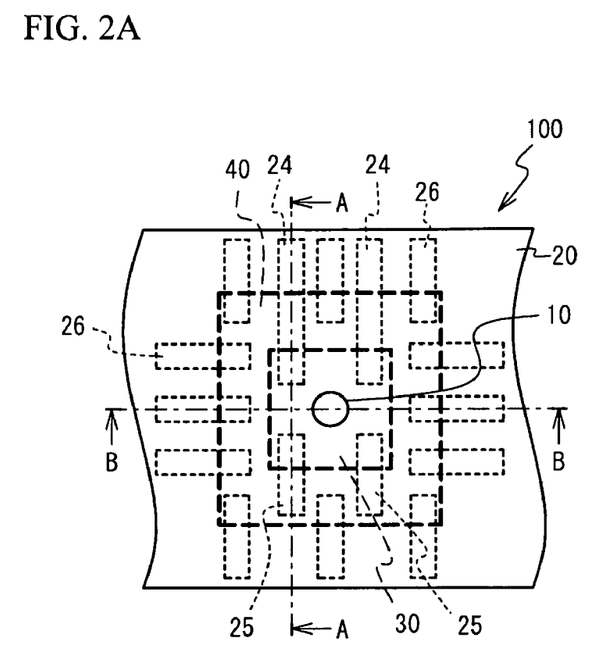
FIG. 2A through FIG. 2D illustrate details of the photoelectric conversion device.
Figure 2B:
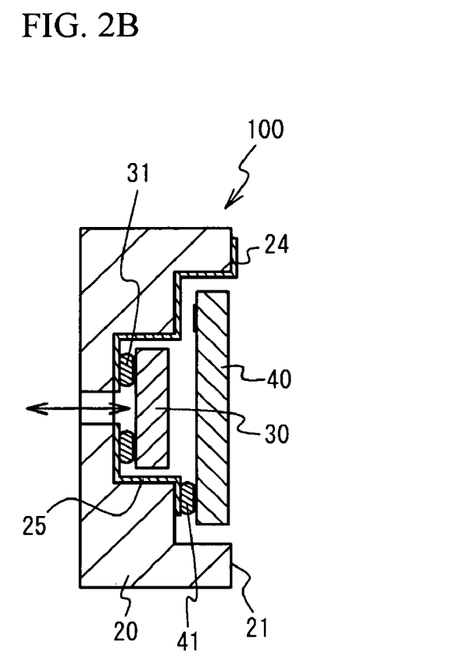
Figure 2C:
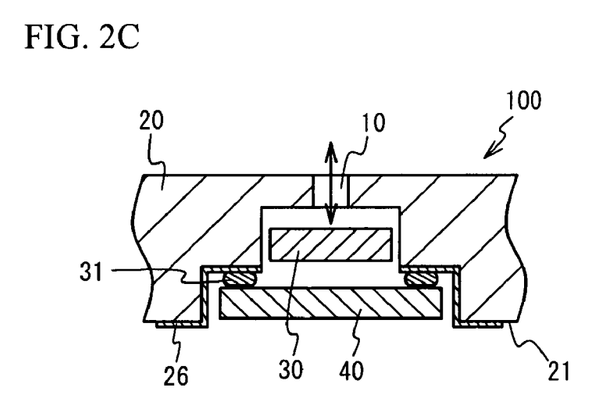
Figure 2D:
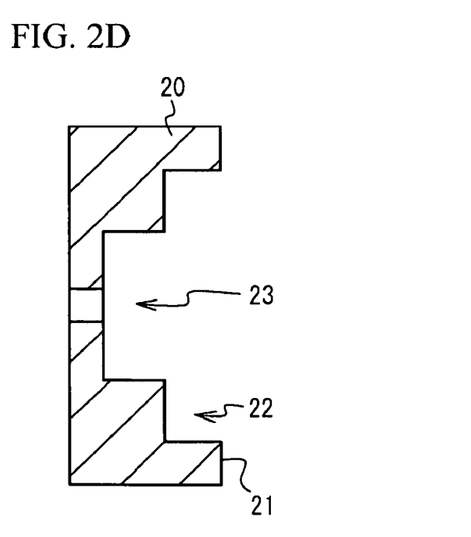

FIG. 2A through FIG. 2D illustrate details of the photoelectric conversion device 100. FIG. 2A illustrates a plane view around one of the light transmission holes 10 of the photoelectric conversion device 100. FIG. 2B illustrates a cross sectional view taken along a line A-A of FIG. 2A. FIG. 2C illustrates a cross sectional view taken along a line B-B of FIG. 2A. FIG. 2D illustrates a cross sectional view of a circuit substrate 20 described later taken along the line A-A.

As illustrated in FIG. 2A through FIG. 2D, the photoelectric conversion device 100 has the circuit substrate 20, an optical element 30 and a circuit chip 40. As illustrated in FIG. 2D, the circuit substrate 20 has a concave portion 22 on a face 21 on an opposite side of the optical connector 201. The concave portion 22 has further a concave portion 23 on a bottom thereof. That is, the concave portion 23 having relatively small diameter is formed on the bottom of the concave portion 22 having relatively large diameter, in the circuit substrate 20. Therefore, a step is formed from the face 21 to the concave portion 22. And another step is formed from the bottom of the concave portion 22 to the concave portion 23.

Metal interconnections 24 through 26 are formed in the concave portion 22 and the concave portion 23 of the circuit substrate 20. The number of the metal interconnections 24 through 26 is one or more. The metal interconnection 24 is formed from the bottom of the concave portion 23 to the face 21 through a side face of the concave portion 23, the bottom of the concave portion 22 and a side face of the concave portion 22. The metal interconnection 24 is an interconnection for heat radiation of the optical element 30. The metal interconnection 25 is formed from the bottom of the concave portion 23 to the bottom of the concave portion 22 through the side face of the concave portion 23. The metal interconnection 25 is a high-speed signal interconnection between the optical element 30 and the circuit chip 40. The metal interconnection 26 is formed from the bottom of the concave portion 22 to the face 21 through the side face of the concave portion 22. The metal interconnection 26 is an interconnection such as a heat radiation interconnection, a low-speed control interconnection, a power supply interconnection, or a ground interconnection of the circuit chip 40.

The optical element 30 is a light-emitting element or a light-receiving element. The optical element 30 is arranged in the concave portion 23 so that an optical axis thereof passes through the light transmission hole 10. The optical element 30 is arranged so that light-receiving region thereof is positioned at the optical axis of the optical fiber core 204, if the optical element 30 is the light-receiving element. The optical element 30 is arranged so that a light from the optical element 30 passes through the light transmission hole 10 and the optical axis of the optical fiber core 204, if the optical element 30 is the light-emitting element. The light transmission hole 10 may be a space or have a transmission member such as a lens.

The optical element 30 is flip-chip bonded to the metal interconnection 24 and to the metal interconnection 25 on the bottom of the concave portion 23 through a solder bump 31. Therefore, the optical element 30 is connected to the face 21 through the metal interconnection 24 and is connected to the bottom of the concave portion 22 through the metal interconnection 25.

The circuit chip 40 is, for example, an IC chip. The circuit chip 40 is an amplifier circuit chip that amplifies a micro signal current generated in the optical element 30 and converts the amplified current to a signal voltage having standard amplitude, if the optical element 30 is the light-receiving element. The circuit chip 40 is a driver circuit chip that generates a signal current from a signal voltage having standard amplitude and provides the signal current to the optical element 30 to drive the optical element 30, if the optical element 30 is the light-emitting element.

The circuit chip 40 is arranged in the concave portion 22 so as to face with the optical element 30. The circuit chip 40 is flip-chip bonded to the metal interconnection 25 and the metal interconnection 26 on the bottom of the concave portion 22 through a solder bump 41. Therefore, the optical element 30 is electrically connected to the circuit chip 40 through the metal interconnection 25. And, the circuit chip 40 is connected to the face 21 through the metal interconnection 26.

It is not necessary to mount the optical element 30 on the circuit chip 40 in the photoelectric conversion device 100 in accordance with the embodiment. In this case, it is not necessary to secure a solder bump area where the optical element 30 is bonded to the circuit chip 40. It is therefore possible to downsize the circuit chip 40. And, the circuit chip 40 is not subjected to thermal stress of flip-chip bonding because it is not necessary to flip-chip bond the optical element 30 to the circuit chip 40. Therefore, arrangement limitation of a transistor or the like on the circuit chip 40 is reduced. This results in enlargement of effective area of the circuit chip 40.

The photoelectric conversion device 100 is downsized because the optical element 30 and the circuit chip 40 are arranged in the concave portion formed in the circuit substrate 20. Depth of the light transmission hole 10 is reduced because the light transmission hole 10 is formed in the concave portion. A distance is therefore reduced between the optical element 30 and the optical fiber core 204.

In this case, it is preferable that a vertical cavity surface emitting laser (VSCEL) is used as the optical element 30. A description will be given of the reason.

It is allowed that positional difference between the optical axis of the optical fiber core 204 and the optical axis of the optical element 30 has margin of plus or minus 10 μm, if the VCSEL is used as the optical element 30. Therefore, the hole diameter of the first hole 1a through the third hole 1c has only to be in a range of +5 μm to +20 μm in addition to the outer diameter of the guide pin 206.

The optical fiber core 204 is optically coupled to the optical element 30 with the light transmission hole 10. In this case, the depth of the light transmission hole 10 determines a distance between an edge of the optical fiber core 204 and the surface of the optical element 30. High efficiency optical connection may be obtained without a lens if the depth of the light transmission hole 10 is adjusted to be 0.05 mm to 0.3 mm with accuracy of plus or minus 0.02 mm to plus or minus 0.05 mm. Therefore, a lens member is not necessary. And position determination of the lens member is not necessary. The optical fiber core 204 may be a multimode fiber if the VCSEL is used as the optical element 30.

The circuit chip 40 may be in contact with the optical element 30. The circuit chip 40 may be separately placed from the optical element 30. It is preferable that the circuit chip 40 is separately placed from the optical element 30 in order to restrain influence of heat generation.

Figure 3A:
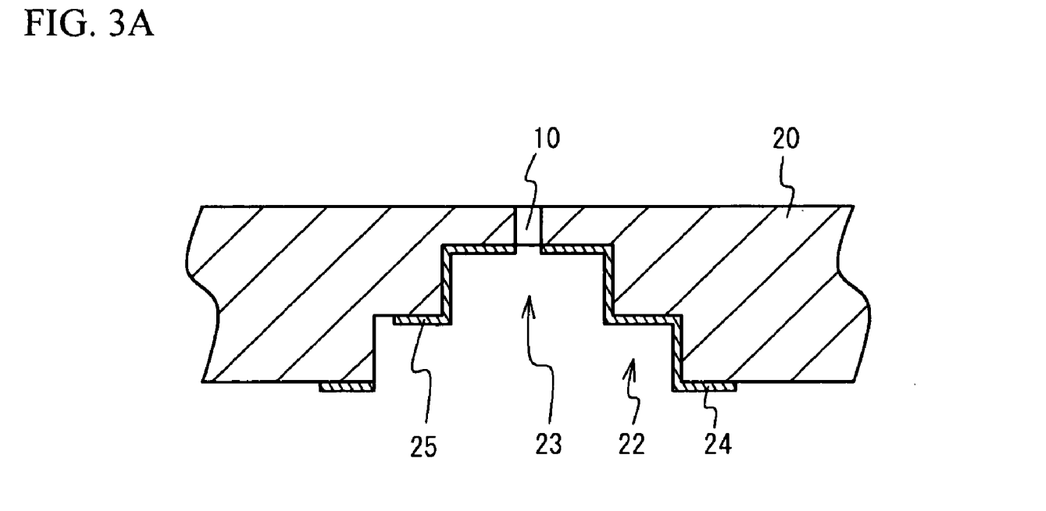
FIG. 3A through FIG. 3C illustrate a flow of a manufacturing method of the photoelectric conversion device.
Figure 3B:
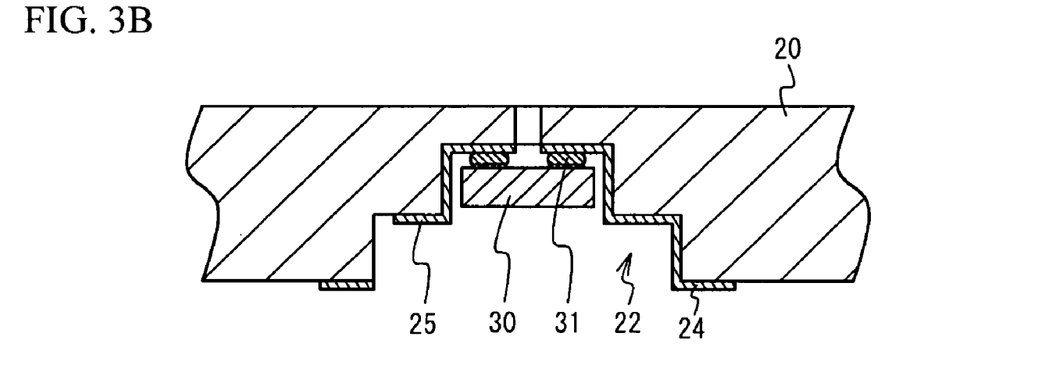
Figure 3C:
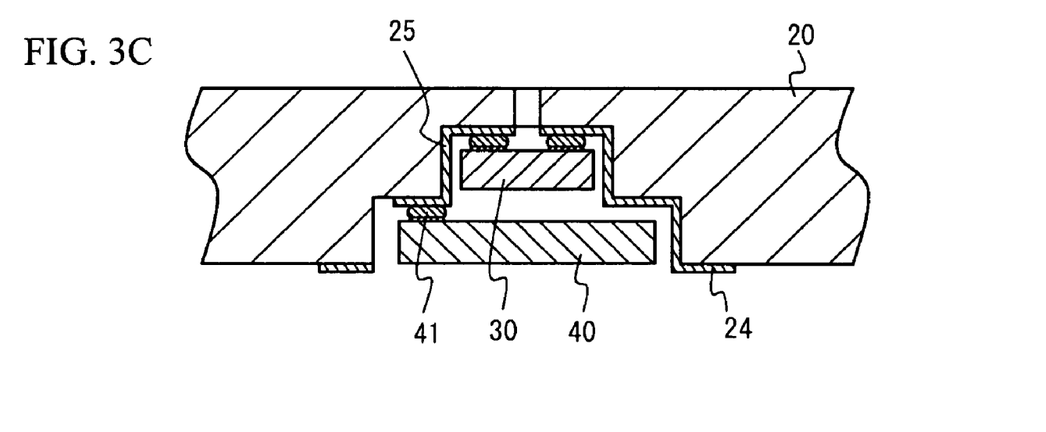

FIG. 3A through FIG. 3C illustrate a flow of a method of manufacturing the photoelectric conversion device 100. A description will be given of the manufacturing method of the photoelectric conversion device 100 with reference to FIG. 3A through FIG. 3C.

As illustrated in FIG. 3A, the circuit substrate 20 having the metal interconnections 24 though 26 is provided. Next, the optical element 30 is arranged in the concave portion 23 of the circuit substrate 20 and is flip-chip bonded to the metal interconnections 24 and 25 on the bottom of the concave portion 23, as illustrated in FIG. 3B. Thus, the optical element 30 is fixed to the circuit substrate 20.

Then, the circuit chip 40 is arranged in the concave portion 22 so as to face with the optical element 30 and is flip-chip bonded to the metal interconnections 25 and 26 of the bottom of the concave portion 22. Therefore, the circuit chip 40 is fixed to the circuit substrate 20. The photoelectric conversion device 100 is manufactured with the processes.

With the manufacturing method illustrated in FIG. 3A through FIG. 3C, the circuit chip 40 is not subjected to thermal stress of flip-chip bonding because it is not necessary to flip-chip bond the optical element 30 to the circuit chip 40. This results in enlargement of the effective area of the circuit chip 40. And wire-bonding process of the circuit substrate 20 and the circuit chip 40 is omitted because the circuit chip 40 is flip-chip bonded to the circuit substrate 20. And a bonding process of the circuit chip 40 to the circuit substrate 20 is omitted.

Figure 4:
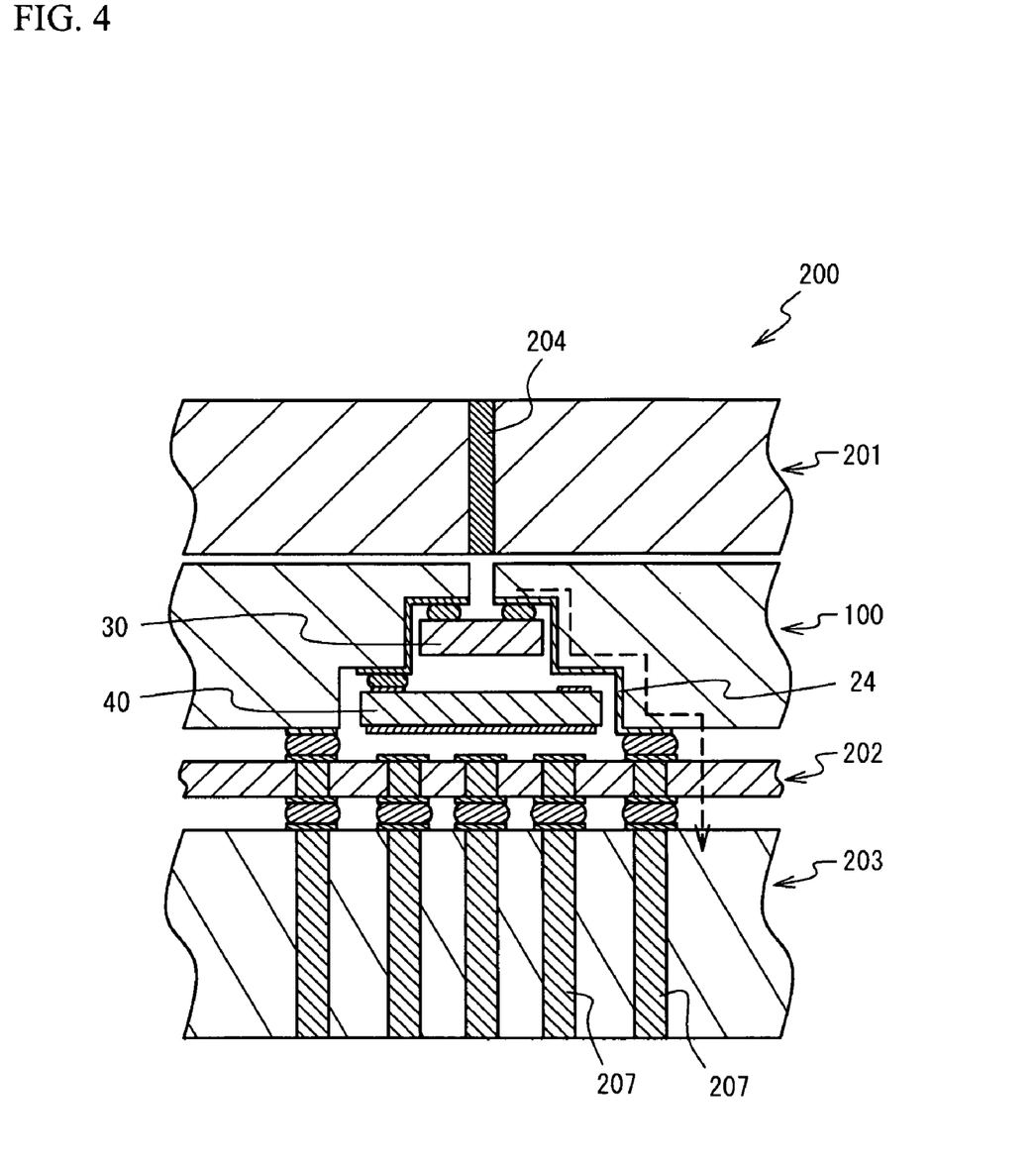
FIG. 4 illustrates a schematic cross sectional view around a light transmittance hole of the photoelectric conversion module.

FIG. 4 illustrates a schematic cross sectional view around the light transmission hole 10 of the photoelectric conversion module 200. A description will be given of a relation between the photoelectric conversion device 100 and the photoelectric conversion module 200, with reference to FIG. 4. As illustrated in FIG. 4, the metal interconnection 24 is connected to the electric interconnection 207 of the electric connector substrate 203 through the via interconnection of the electrode contact sheet 202. The metal interconnection 26 is connected to the electric interconnection 207 of the electric connector substrate 203 through the via interconnection. Therefore, heat is radiated from the optical element 30 and the circuit chip 40 to the electric connector substrate 203. This results in a restraint of influence of heat generation of the optical element 30 and the circuit chip 40.

Figure 5:
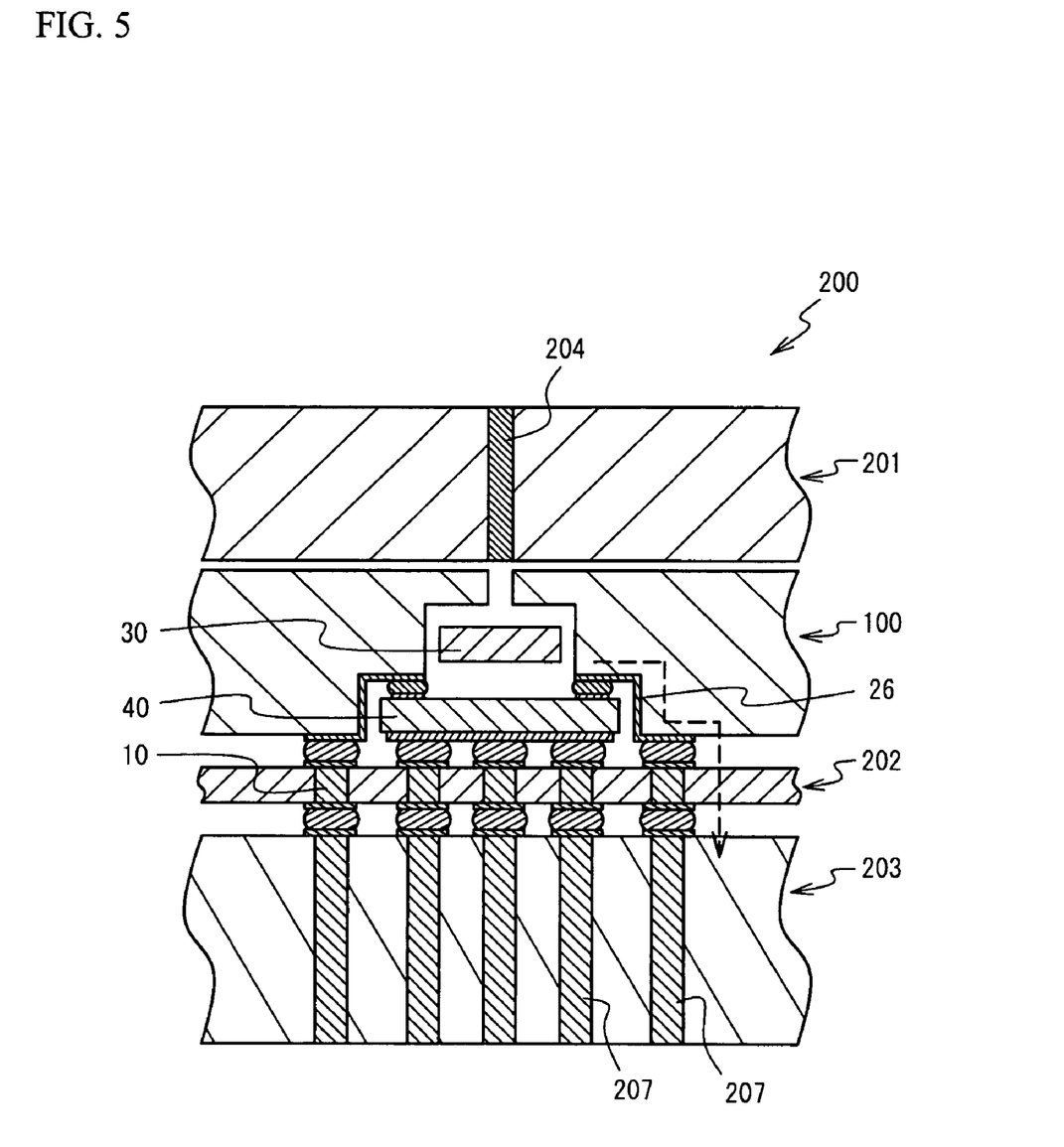
FIG. 5 illustrates a schematic cross sectional view accounting for another example of the photoelectric conversion module.

FIG. 5 illustrates a schematic cross sectional view of another example of the photoelectric conversion module 200. As illustrated in FIG. 5, a face of the circuit chip 40 on an opposite side of the optical element 30 may be connected to the electric interconnection 207 of the electric connector substrate 203 through the via interconnection of the electrode contact sheet 202. In this case, the heat radiation from the circuit chip 40 is promoted. A metal carrier or the like may be provided on the face of the circuit chip 40 connected to the via interconnection in order to improve the heat radiation efficiency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A photoelectric conversion device comprising:
    a circuit substrate that has a first concave portion having a light transmission hole penetrating a bottom of the first concave portion;
    a first metal interconnection that is formed from the bottom of the first concave portion to a face of the circuit substrate where the first concave portion is formed;
    an optical element that is arranged in the first concave portion so that an optical axis thereof passes through the light transmission hole and is flip-chip bonded to the first metal interconnection on the bottom of the first concave portion; and
    a circuit chip that is a driver circuit chip for driving the optical element or an amplifier circuit chip for amplifying a signal from the optical element and is flip-chip bonded to the first metal interconnection of the face where the first concave portion is formed.

2. The photoelectric conversion device as claimed in claim 1, wherein:
    the face where the first concave portion is formed is a bottom of a second concave portion formed in a first face of the circuit substrate; and
    the circuit chip is arranged in the second concave portion.

3. The photoelectric conversion device as claimed in claim 2 further comprising a second metal interconnection that is formed from the bottom of the second concave portion to the first face of the circuit substrate,
    wherein the circuit chip is flip-chip bonded to the second metal interconnection on the bottom of the second concave portion.

4. The photoelectric conversion device as claimed in claim 2 further comprising a second metal interconnection that is formed from the bottom of the first concave portion to the first face of the circuit substrate,
    wherein the optical element is flip-chip bonded to the second metal interconnection on the bottom of the first concave portion.

5. The photoelectric conversion device as claimed in claim 1, wherein:
    the optical element is a vertical cavity surface emitting laser; and
    the light transmission hole is a space.

6. A photoelectric conversion module comprising:
    an optical connector that has a guide pin;
    a photoelectric conversion device having a circuit substrate, a first metal interconnection, an optical element and a circuit chip, the circuit substrate having a first concave portion having a light transmission hole, the first metal interconnection being formed from a bottom of the first concave portion to a face of the circuit substrate where the first concave portion is formed, the optical element being arranged in the first concave portion so that an optical axis thereof passes through the light transmission hole and being flip-chip bonded to the first metal interconnection on the bottom of the first concave portion, the circuit chip being a driver circuit chip for driving the optical element or an amplifier circuit chip for amplifying a signal from the optical element and being flip-chip bonded to the first metal interconnection at the face where the first concave portion is formed;
    an electrode contact sheet having a second hole where the guide pin is to be inserted; and
    an electric connector substrate having a third hole where the guide pin is to be inserted,
    wherein the guide pin is inserted into the first hole through the third hole in order.

7. The photoelectric conversion module as claimed in claim 6 wherein the electrode contact sheet is in contact with the photoelectric conversion device.

8. The photoelectric conversion module as claimed in claim 6, wherein:
    the face where the first concave portion is formed is a bottom of a second concave portion formed in a first face of the circuit substrate; and
    the circuit chip is arranged in the second concave portion.

9. The photoelectric conversion module as claimed in claim 8 further comprising a second metal interconnection that is formed from the bottom of the second concave portion to the first face of the circuit substrate, wherein the circuit chip is flip-chip bonded to the second metal interconnection on the bottom of the second concave portion.

10. The photoelectric conversion module as claimed in claim 8 further comprising a second metal interconnection that is formed from the bottom of the first concave portion to the first face of the circuit substrate, wherein the optical element is flip-chip bonded to the second metal interconnection on the bottom of the first concave portion.

11. The photoelectric conversion module as claimed in claim 6, wherein:

the optical element is a vertical cavity surface emitting laser; and the light transmission hole is a space.

12. A method of manufacturing a photoelectric conversion device comprising:

providing a circuit substrate that has a concave portion having a light transmission hole penetrating a bottom of the concave portion and has a metal interconnection formed from the bottom of the concave portion to a face of the circuit substrate where the concave portion is formed;

arranging an optical element in the concave portion so that an optical axis of the optical element passes through the light transmission hole, and flip-chip bonding the optical element to the metal interconnection on the bottom of the concave portion; and flip-chip bonding a driver circuit for driving the optical element or an amplifier circuit for amplifying a signal from the optical element to the metal interconnection on the face where the concave portion is formed.

* * * * *

UNITED STATES PATENT AND TRADEMARK OFFICE
CERTIFICATE OF CORRECTION

PATENT NO. : 8,090,228 B2
APPLICATION NO. : 12/382909
DATED : January 3, 2012
INVENTOR(S) : Hiroyuki Nobuhara It is certified that error appears in the above-identified patent and that said Letters Patent is hereby corrected as shown below:

Title Page, Column 2 (Abstract), Line 13, Delete "of" and insert -- at --, therefor.

Column 6, Line 4, In Claim 1, delete "of" and insert -- at --, therefor.

Signed and Sealed this
Twenty-ninth Day of May, 2012

David J. Kappos
*Director of the United States Patent and Trademark Office*